United States Patent
Meade et al.

(10) Patent No.: US 8,815,704 B2
(45) Date of Patent: *Aug. 26, 2014

(54) SEMICONDUCTOR SUBSTRATE FOR PHOTONIC AND ELECTRONIC STRUCTURES AND METHOD OF MANUFACTURE

(71) Applicant: Micron Technology, Inc., Boise, ID (US)

(72) Inventors: Roy Meade, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/151,083

(22) Filed: Jan. 9, 2014

(65) Prior Publication Data

US 2014/0175596 A1 Jun. 26, 2014

Related U.S. Application Data

(63) Continuation of application No. 13/726,891, filed on Dec. 26, 2012, now Pat. No. 8,652,934.

(51) Int. Cl.
   *H01L 21/76* (2006.01)
   *H01L 29/00* (2006.01)

(52) U.S. Cl.
   USPC ............ 438/427; 438/424; 257/506

(58) Field of Classification Search
   USPC ......... 438/424, 425, 427, 428, 435, 444; 257/506, 510
   See application file for complete search history.

(56) References Cited

U.S. PATENT DOCUMENTS

| | | | |
|---|---|---|---|
| 4,211,582 A | 7/1980 | Horng et al. | |
| 5,747,377 A | 5/1998 | Wu | |
| 5,923,993 A | 7/1999 | Sahota | |
| 6,372,605 B1 | 4/2002 | Kuehne et al. | |
| 6,790,742 B2 | 9/2004 | Yang et al. | |
| 7,057,257 B2 | 6/2006 | Tran | |
| 7,071,531 B2 | 7/2006 | Rhodes | |
| 7,247,571 B2 | 7/2007 | Chen et al. | |
| 7,285,433 B2 | 10/2007 | Kretchmer et al. | |
| 7,338,848 B1 | 3/2008 | Kempf | |
| 7,354,812 B2 | 4/2008 | Batra et al. | |
| 7,920,770 B2 | 4/2011 | Holzwarth et al. | |
| 8,652,934 B1 * | 2/2014 | Meade et al. | 438/427 |
| 2004/0251481 A1 | 12/2004 | Rhodes | |
| 2006/0043455 A1 | 3/2006 | Batra et al. | |
| 2009/0325359 A1 | 12/2009 | Liu et al. | |
| 2011/0158582 A1 | 6/2011 | Su et al. | |

* cited by examiner

*Primary Examiner* — Kevin M Picardat
(74) *Attorney, Agent, or Firm* — Dickstein Shapiro LLP

(57) ABSTRACT

A method of forming a substrate with isolation areas suitable for integration of electronic and photonic devices is provided. A common reticle and photolithographic technique is used to fabricate a mask defining openings for etching first and second trench isolation areas in a substrate, with the openings for the second trench isolation areas being wider than the openings for the first trench isolation areas. The first and second trench isolation areas are etched in the substrate through the mask. The second trench isolation areas are further etched to the deeper than the first trench isolation areas. The trench isolation areas are filled with oxide material. Electrical devices can be formed on the substrate and electrically isolated by the first trench isolation areas and photonic devices can be formed over the second trench isolation areas and be optically isolated from the substrate.

24 Claims, 2 Drawing Sheets

US 8,815,704 B2

SEMICONDUCTOR SUBSTRATE FOR PHOTONIC AND ELECTRONIC STRUCTURES AND METHOD OF MANUFACTURE

This application is a continuation of U.S. application Ser. No. 13/726,891, filed Dec. 26, 2012, the entire disclosure of which is incorporated herein by reference.

FIELD OF THE INVENTION

Embodiments described herein relate to a common semiconductor substrate and to a method of its formation which isolate electronic and photonic devices fabricated on the substrate.

BACKGROUND OF THE INVENTION

There is a current trend to integrate photonic devices and electronic devices on the same semiconductor substrate. A silicon-on-insulator (SOI) substrate can be used as the supporting substrate for such integration. However, photonic structures such as waveguides built over an SOI substrate generally require a thick buried oxide (BOX) in the SOI substrate for optical isolation compared with a thinner BOX typically required for electrical isolation of electronic devices. For example, to prevent evanescent coupling of a photonic waveguide core to the supporting silicon beneath the BOX, the BOX material must be relatively thick, for example, greater than 1.0 µm and often 2.0 µm-3.0 µm thick. When the BOX material has such a thickness, it inhibits heat flow to the underlying silicon, the latter of which acts as a heat dissipator for both electronic and photonic devices. By comparison, when certain electronic devices, such as high speed logic circuits, are integrated on the same SOI substrate as photonic devices, the BOX of the SOI substrate should be much thinner, for example, in the range of 100-200 nm. Such BOX insulator, while providing a good SOI substrate for electronic devices, is insufficient to prevent optical coupling of the waveguide core to the underlying supporting silicon of the SOI substrate, which causes undesirable optical signal loss. Accordingly, a complex multiple-mask process is required to provide an SOI substrate, or non-SOI substrate, which has suitable electrical and optical isolation having different depths in different areas of the substrate for electronic and photonic devices.

In addition, although SOI substrates are often used for fabrication of electronic devices and photonic devices on the same substrate, SOI substrates are relatively expensive to produce compared with non-SOI substrates and can often also be of limited supply.

Accordingly, a simplified method is needed for providing a common semiconductor substrate having isolation areas of different depths for isolating electronic and photonic devices.

DETAILED DESCRIPTION OF THE INVENTION

In the following detailed description, reference is made to the accompanying drawings which form a part hereof, and in which is shown by way of illustration specific embodiments that may be practiced. These embodiments are described in sufficient detail to enable those skilled in the art to make and use them, and it is to be understood that structural, logical, or procedural changes may be made to the specific embodiments disclosed without departing from the spirit and scope of the invention.

The embodiments described herein provide a simplified method for forming a semiconductor substrate structure on which both photonic devices and electronic circuits can be formed with a shallow trench electrical isolation for the electrical devices and deep trench optical isolation for photonic devices, e.g., waveguides, detectors, taps, splitters, modulators, demodulators and other photonic devices.

The described embodiments use a common reticle to form a common etch mask which has first and second trench isolation area openings. The second trench isolation area openings are wider than the first trench isolation area openings. The mask-defined first and second trench isolation area openings are used to respectively etch first and second trenches in a semiconductor substrate. The first and second trenches are initially etched to the same depth and filled with oxide. The oxide completely fills the first narrower trenches and partially fills the second wider trenches. The oxide is removed from the bottom of second trenches and the second trenches are then further etched such that they are deeper than the first trenches, after which they are filled with oxide. The substrate is then planarized and has both shallow and deep trench isolation regions therein. The isolation regions can be formed in a semiconductor substrate which does not have a silicon-on-insulator construction. Electronic devices are fabricated in an area of the substrate having the shallow isolation trenches which provide electrical insulation. Photonic devices are fabricated over the deep trench isolation regions which provide optical insulation between the photonic devices and underlying substrates.

Figure 1:
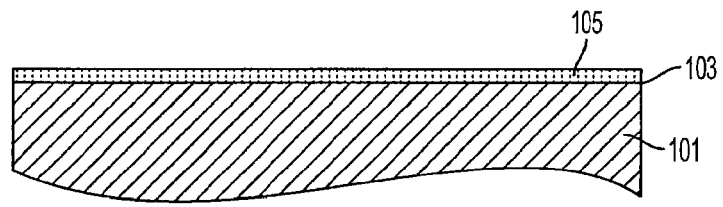
FIG. 1 is a cross-sectional view of a silicon substrate showing an early stage of fabrication in accordance with an embodiment of the invention.
Figure 2:
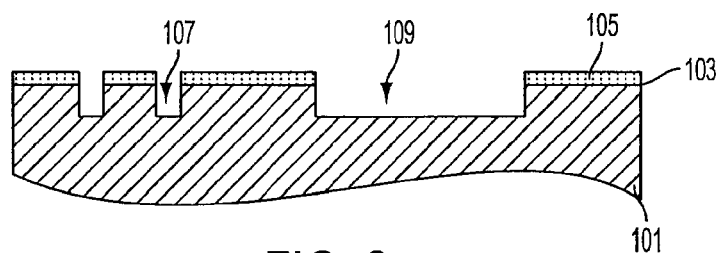
FIG. 2 is a cross-sectional view of the substrate at a stage of fabrication subsequent to that shown in FIG. 1.

Embodiments will now be described with reference to FIGS. 1 to 7. FIG. 1 illustrates a semiconductor, e.g., silicon or polysilicon, substrate 101 at an early stage of trench isolation formation. A pad oxide 103, for example, silicon dioxide, is grown or deposited on the upper surface of the substrate 101 to protect the substrate from a subsequently formed hard mask 105. The hard mask 105 formed, for example, of silicon nitride, is deposited over the pad oxide 103. As shown in FIG. 2, photolithography techniques can be used with a single reticle to pattern the hard mask 105 such that the hard mask 105 has first narrower openings for etching first trenches 107 for use in forming shallow trench isolation regions and second wider penings for etching second trenches 109 for use in forming deeper trench isolation regions. The first openings for etching trenches 107 can each be from about 20 nm to about 150 nm wide. The second trenches 109 may be from about 2 µm to about 10 µm wide. Since the second trenches 109 will be used to isolate a photonic device, e.g., a waveguide, formed of silicon having cladding the mask 105 second openings may have a width in the range of about 2 μm to about 4 μm for photonic device widths of from amount 300 nm to about 2 μm. A wet or dry etch may be used to commonly etch the first 107 and second 109 trenches in the silicon substrate 101 through the first and second openings in the patterned hard mask 105. The etch trenches 107, 109 will have widths corresponding to the widths of the first and second openings in the hard mask 105. The depth of the etched trenches 107 and 109 can be from about 200 nm to about 300 nm.

Figure 3:
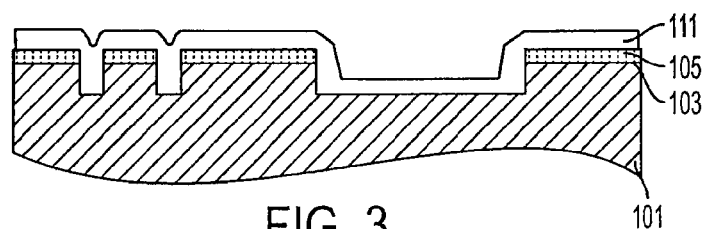
FIG. 3 is a cross-sectional view of the substrate at a stage of fabrication subsequent to that shown in FIG. 2.
Figure 4:
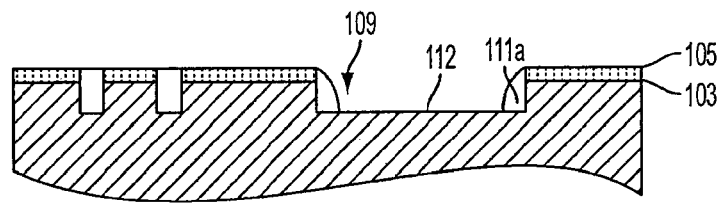
FIG. 4 is a cross-sectional view of the substrate at a stage of fabrication subsequent to that shown in FIG. 3.

Once the first 107 and second 109 trenches are etched, as shown in FIG. 2, a thin trench isolation oxide 111, e.g. silicon dioxide, is deposited over and/or grown on the substrate 101 to fill the first 107 and second 109 trenches and overlie the hard mask 105, as shown in FIG. 3. The oxide may have a thickness of about one-half the depth of the trenches, for example, about 100 nm to about 150 nm. As shown in FIG. 4 the narrower first trenches 107 are completely filled by oxide 111, while the wider second trenches are partially filled by oxide 111.

As shown in FIG. 4, the oxide 111 can then be planarized to the level of hard mask 105, and the oxide 111 can then be selectively removed from the bottom 112 of the second trenches 109 using an anisotropic wet etch or a plasma dry etch, leaving a small portion of oxide 111 as a sidewall spacer 111a at the sidewalls of trenches 109. The width of trenches 107 should be such that removal of the oxide from the bottom 112 of the second trenches leaves trenches 107 at least partially, if not completely, filled with oxide. This etch exposes substrate 101 for further etching of trenches 109.

Figure 8:
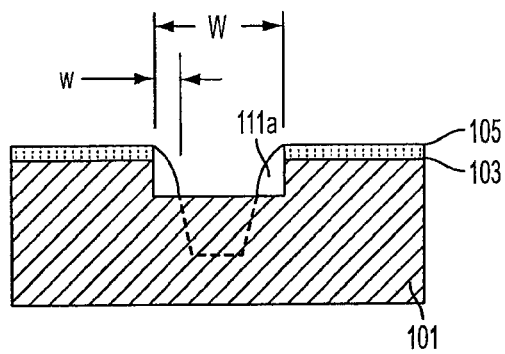
FIG. 8 illustrates a relationship between a width of a trench and a width of a sidewall in forming deep trenches.

FIG. 8 illustrates a relationship between the width of a trench W and a width w of a sidewall spacer (111a) which can be used to achieve exposure of the silicon substrate 101. When W>2w the substrate 101 is exposed through trenches 109 for further etching. Thus, if in one example the sidewall spacer width w is 100 nm, then the second trenches 109 can have a width w of at least 200 nm to ensure exposure of the substrate 101. Conversely, if W<2w the oxide 111 will not be etched sufficiently to expose substrate 101.

It should be noted that sidewall spacer 111a is an artifact from the removal of the oxide 111 at the second trench 109. Depending on selected wet and/or dry etch conditions, the sidewall spacers 111a could be completely removed during the etch to expose substrate 101.

Figure 5:
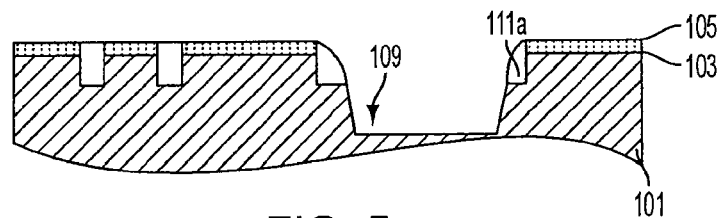
FIG. 5 is a cross-sectional view of the substrate at a stage of fabrication subsequent to that shown in FIG. 4.

As shown in FIG. 5, a further anisotropic wet etch or a plasma dry etch which does not disturb the oxide 111 can be performed on the second trenches 109 using the sidewall oxide spacer 111a (if present) and hard mask 105 second openings as an etch mask to etch the second trenches 109 to a depth deeper than that of the first trenches 107, for example, to a depth of at least twice that of the first trenches 107. For photonic device isolation, the depth of the second trenches 109 can be in the range of about 1.2 μm to about 1.5 μm. If the sidewall oxide spacer 111a is not present, this further etch is defined solely by the hard mask 105 second openings.

Figure 6:
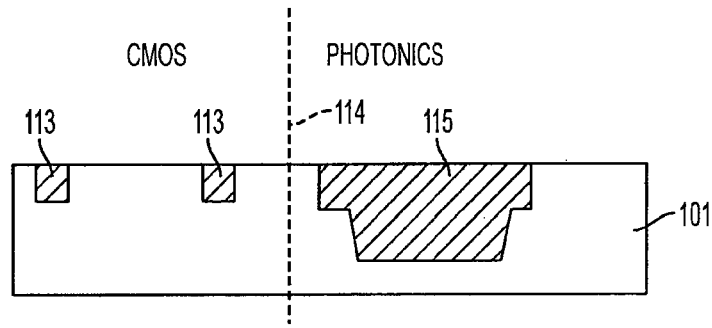
FIG. 6 is a cross-sectional view of the substrate at a stage of fabrication subsequent to that shown in FIG. 5.

After the second trenches 109 are further etched in the manner described in relation to FIG. 5, a second oxide, e.g., silicon dioxide, can be deposited over substrate 101 to fill the second trenches 109 after which the entire structure is planarized to the surface of substrate 101 using CMP or other known planarizing techniques to remove oxide above the surface of substrate 101 as well as the oxide hard pad 103 and hard mask 105. Alternatively, the oxide hard mask, 105 and pad oxide 103 can be removed by a phosphoric acid substrate etch. The resulting planarized structure is illustrated in FIG. 6.

The FIG. 6 substrate 101 has shallow first shallow trench isolation regions 113 for electrically isolating subsequently fabricated electronic devices, and second deeper trench isolation regions 115 to optically isolate photonic devices, fabricated over them from the semiconductor substrate 101. The FIG. 6 substrate can be used for fabrication of both CMOS circuits and photonic devices and circuits on the same substrate 101. FIG. 6 also shows a dotted line 114 representing the respective areas on substrate 101 where CMOS devices and circuits and photonic devices and circuits can be formed.

Figure 7:
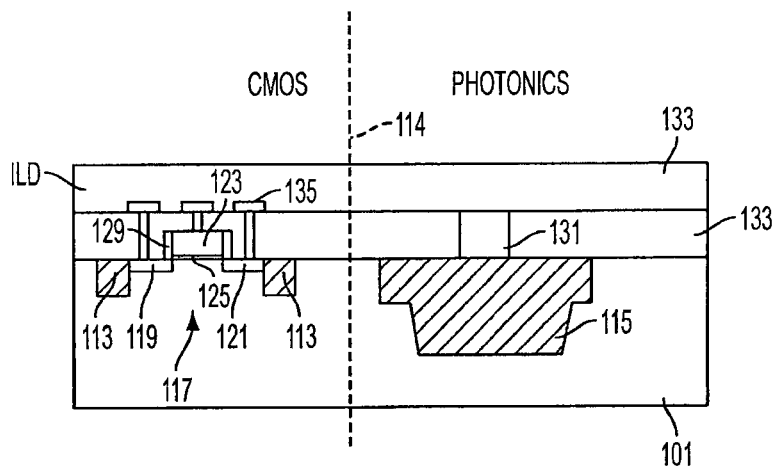
FIG. 7 is a cross-sectional view of the substrate at a stage of fabrication subsequent to that shown in FIG. 6.

FIG. 7 shows an example of a partially fabricated CMOS/photonic integrated circuit structure. Semiconductor substrate 101 has transistor 117 having doped source 119 and drain 121 regions and a gate 123 over a gate oxide 125, and gate oxide sidewalls 129 fabricated thereon. The shallow first trench isolation areas 113 isolate the transistor 117 from other electronic devices fabricated on substrate 101. FIG. 7 also shows a photonic device formed as a silicon waveguide core 131 over and on a isolation deeper trench isolation region 115. Waveguide core 131 requires surrounding cladding having a lower index of refraction than silicon, which is about 3.47. This cladding is provided by the second deeper trench isolation region 115 and by an oxide material 133 on either side of and above the waveguide core 131. The oxide with the second trench area 115, and the oxide surrounding the waveguide core 131, has an index of refraction about 1.54, for example. Other materials having other indexes of refraction can also be used. The oxide material 133 can be silicon dioxide or BPSG oxide material 133, which materials can also be used as part of an interlayer dielectric (ILD) structure associated with one or more metal layers 135 which are used to electrically interconnect the electronic devices and photonic devices fabricated over substrate 101.

The embodiments described provide a method of forming a non-SOI substrate having shallow trench and deep trench isolation regions suitable for integration of both electronic and photonic devices on the same substrate using a single reticle to form a hard mask structure for etching.

While example embodiments of a method and structure are described above such description is not to be taken as limiting the invention as various modifications can be made without departing from the spirit or scope of the invention. Accordingly, the invention is only limited by the scope of the appended claims.

What is claimed as new and desired to be protected by Letters Patent of the United States is:

1. A method of forming an integrated structure, the method comprising:
   forming an etch mask material over a semiconductor substrate;
   using a single reticle in a photolithographic process to pattern the etch mask material to define a first and a second opening for forming a first and a second trench isolation area, the second opening being wider than the first opening;
   etching first and second trench isolation areas in the semiconductor substrate using the patterned etch mask material;
   processing the etched first and second trench isolation areas to produce first and second trench isolation areas, filled with a dielectric material, the second dielectric filled trench isolation area being deeper than the dielectric filled first trench isolation area;
   forming a photonic device over the dielectric filled second trench isolation area such that the photonic device is optically isolated from the substrate.

2. A method as in claim 1, further comprising planarizing to the level of an upper surface of the substrate after the first trench isolation area and second trench isolation areas are filled with dielectric.

3. A method as in claim 2, wherein the semiconductor substrate comprises a silicon substrate.

4. A method as in claim 2, further comprising forming an oxide between the etch mask material and substrate, wherein the single reticle and photolithograph process patterns the etch mask material and pad oxide.

5. A method as in claim 1, wherein the dielectric material comprises an oxide.

6. A method as in claim 1, wherein the processing produces a second trench isolation area which is at least twice as deep as the first trench isolation area.

7. A method as in claim 6, wherein the first trench isolation area is about 200 nm to about 300 nm deep.

8. A method as in claim 6, wherein the second trench isolation area is about 1.2 µm to about 1.5 µm deep.

9. A method of forming an integrated structure, the method comprising:
    using a single reticle in a photolithographic process to pattern an etch mask provided over a semiconductor substrate, the pattern defining openings for etching first trench isolation areas and at least one second trench isolation area in the substrate, the opening for etching the at least one second trench isolation area being wider than the openings for etching the first trench isolation areas;
    removing semiconductor material from the substrate using the first and second openings in the etch mask to provide the first and second trench isolation areas;
    further etching the at least one second trench isolation area to be deeper than the first trench isolation areas;
    filling the first and second trench isolation areas with a dielectric material;
    planarizing the first and second trench isolation areas to the level of the substrate; and,
    forming a photonic device on the at least one planarized second trench isolation area.

10. A method as in claim 9, wherein the first trench isolation areas have a width of about 20 nm to about 150 nm.

11. A method as in claim 9, wherein the at least one second trench isolation area has a width of about 2 µm to about 10 µm.

12. A method as in claim 11, wherein the at least one second trench isolation area has a width of about 2 µm to about 4 µm.

13. The method as in claim 9, wherein the at least one second trench isolation area is etched to be at least twice as deep as the first trench isolation areas.

14. The method as in claim 9, further comprising fabricating optical isolation areas on the sides and over the photonic device.

15. The method as in claim 14, wherein the optical isolation areas are part of an interlayer dielectric structure.

16. A method of forming an integrated structure, the method comprising:
    forming first and second dielectric filled trench isolation areas in a semiconductor substrate, which have upper surfaces which are planar with the upper surface of the substrate, the second isolation area being wider and deeper than the first isolation area, the locations of the first and second dielectric filled trench isolation areas being defined by a hard mask patterned by a single reticle;
    forming an electronic device on the substrate which is electrically isolated by the first trench isolation area; and
    forming a photonic device on the second trench isolation area, the photonic device being optically isolated from the substrate by the second trench isolation area.

17. An integrated circuit structure comprising:
    a semiconductor substrate having a planar upper surface;
    a first trench isolation area having a first depth into the substrate from the planar upper surface;
    an electronic device electrically isolated by the first trench isolation area;
    a second trench isolation area having a second depth into the substrate from the planar upper surface, where the second depth is greater than the first depth, the second trench isolation area having a planar upper surface; and
    a photonic device on the planar upper surface of the second trench isolation area, the photonic device being optically isolated from the substrate by the second trench isolation area.

18. An integrated circuit structure as in claim 17, wherein the second trench area does not extend through the entirety of the substrate.

19. An integrated circuit structure as in claim 17, wherein the second trench isolation area is at least twice as deep as the first trench isolation area.

20. An integrated circuit structure as in claim 17, wherein the second trench isolation area has a depth in the range of about 1.2 um to about 1.5 um deep.

21. An integrated circuit structure as in claim 17, wherein the width of the second trench isolation area is greater than the width of the first trench isolation area.

22. An integrated circuit structure as in claim 21, wherein the width of the second trench isolation area is greater than twice the width of the first trench isolation area.

23. An integrated circuit structure as in claim 22, wherein the width of the first trench isolation area is in the range of about 20 nm to about 150 nm and the width of the second trench isolation area is in the range of about 2 um to about 10 um.

24. An integrated circuit structure as in claim 23, wherein the second trench isolation area has a width in the range of about 2 um to about 4 um.

* * * * *